(12) United States Patent
Tixhon et al.

(10) Patent No.: US 10,276,352 B2
(45) Date of Patent: Apr. 30, 2019

(54) PAIR OF ELECTRODES FOR DBD PLASMA PROCESS

(71) Applicant: AGC Inc., Chiyoda-ku (JP)

(72) Inventors: M. Eric Tixhon, Crisnee (BE); M. Eric Michel, Glain (BE); M. Joseph LeClercq, Sart en Fagne (BE)

(73) Assignee: AGC INC., Chiyoda-ku (JP)

( * ) Notice: Subject to any disclaimer, the term of this patent is extended or adjusted under 35 U.S.C. 154(b) by 518 days.

(21) Appl. No.: 14/654,341

(22) PCT Filed: Dec. 18, 2013

(86) PCT No.: PCT/JP2013/007433
§ 371 (c)(1),
(2) Date: Jun. 19, 2015

(87) PCT Pub. No.: WO2014/097621
PCT Pub. Date: Jun. 26, 2014

(65) Prior Publication Data
US 2015/0348759 A1    Dec. 3, 2015

(30) Foreign Application Priority Data
Dec. 21, 2012 (EP) .................................. 12199080

(51) Int. Cl.
*H01J 37/32* (2006.01)
*C03C 17/245* (2006.01)
(Continued)

(52) U.S. Cl.
CPC ...... *H01J 37/32348* (2013.01); *C03C 17/002* (2013.01); *C03C 17/245* (2013.01);
(Continued)

(58) Field of Classification Search
None
See application file for complete search history.

(56) References Cited

U.S. PATENT DOCUMENTS

2002/0007793 A1    1/2002 Sakai et al.
2006/0118242 A1*   6/2006 Herbert ............... C23C 16/5096
                                                    156/345.43
(Continued)

FOREIGN PATENT DOCUMENTS

EP    2 145 978 A1    1/2010
FR    2 912 256 A1    8/2008
(Continued)

OTHER PUBLICATIONS

International Search Report dated Mar. 5, 2014 in PCT/JP13/007433 Filed Dec. 18, 2013.

*Primary Examiner* — Joseph A Miller, Jr.
(74) *Attorney, Agent, or Firm* — Oblon, McClelland, Maier & Neustadt, L.L.P.

(57) ABSTRACT

The present invention concerns a device (10) for the surface treatment of a substrate (1) by dielectric barrier discharge that enables the generation of a cold filamentary plasma at atmospheric pressure, comprising a reaction chamber, in which are positioned means for supporting and/or moving the substrate (2) and at least two electrodes (3, 4) arranged in parallel on either side of the means for supporting and/or moving the substrate (2), of which one electrode (3) is intended to be brought to high voltage and a counter-electrode (4) to be earthed. It is characterised in that the counter-electrode (4) has a width ($l_{ce}$) and a length ($L_{ce}$) that are respectively smaller than the width ($l_e$) and the length ($L_e$) of the electrode (3), and in that the counter-electrode (4) is positioned so that it is enclosed in an orthogonal projection (5) of the electrode (3) on a plane containing the counter-electrode (4). The invention also concerns a surface treatment process, in particular for layer deposition, that calls for such a device.

15 Claims, 2 Drawing Sheets

(51) Int. Cl.
*C03C 17/00* (2006.01)
*C23C 16/40* (2006.01)
*C23C 16/509* (2006.01)
*C23C 16/54* (2006.01)

(52) U.S. Cl.
CPC .......... *C23C 16/402* (2013.01); *C23C 16/509* (2013.01); *C23C 16/545* (2013.01); *H01J 37/32568* (2013.01); *H01J 37/32715* (2013.01); *C03C 2217/213* (2013.01); *C03C 2218/15* (2013.01); *C03C 2218/153* (2013.01); *H01J 2237/332* (2013.01)

(56) References Cited

U.S. PATENT DOCUMENTS

| | | |
|---|---|---|
| 2011/0042347 A1 | 2/2011 | Korngold et al. |
| 2011/0183083 A1 | 7/2011 | Tixhon et al. |
| 2012/0258260 A1* | 10/2012 | Michel .............. H01J 37/32348 427/569 |
| 2014/0242365 A1* | 8/2014 | De Vries ............. C23C 16/0272 428/216 |

FOREIGN PATENT DOCUMENTS

| | | |
|---|---|---|
| FR | 2 923 945 A1 | 5/2009 |
| JP | 2003-302774 A | 10/2003 |
| JP | 2006-80192 A | 3/2006 |
| WO | 2009/096785 A1 | 8/2009 |

\* cited by examiner

PAIR OF ELECTRODES FOR DBD PLASMA PROCESS

TECHNICAL FIELD

The invention relates to dielectric barrier discharge processes for the surface treatment of substrates, and in particular for the deposition of layers onto plates of glass. In particular, the invention concerns a pair of electrodes formed from an electrode and a counter-electrode positioned on either side of the substrate.

BACKGROUND ART

Plasma surface treatment is well known in particular in the glassmaking field. It consists of generating a plasma between at least two electrodes and injecting precursor products into this plasma that result in the occurrence, by reaction and/or ionisation, of reagents that act on the surfaces to be treated.

PECVD (plasma-enhanced chemical vapour deposition) may be applied using any plasma: cold plasmas (not in equilibrium) or thermal plasmas (in equilibrium). Cold plasmas are generally preferred. The active species (electrons, ions, metastables, etc.) of the plasma typically possess energies of a few eV and may thus cause dissociation or activation of chemical precursors. To maintain the non-equilibrium plasma, it is often necessary to work at reduced pressure. Most known PECVD techniques therefore use low-pressure plasmas.

However, to apply this process for industrial purposes, it is necessary to minimize the costs. There is therefore a growing interest on the part of industrial manufacturers to put aside low-pressure plasma technologies and go for plasma technologies operating within a pressure range close to atmospheric pressure.

Various plasma types are known in plasma technologies: "Glow discharge plasma" or homogeneous plasma allows deposition of very homogeneous thin-film coatings and requires a relatively low energy level. However, it is lengthy and must be limited within a restricted frequency field to remain stable. It also allows a more restricted variety of thin-film species.

Raising the energy level of plasma may cause the outbreak of electric arcs. Placing a dielectric plate between the electrodes allows obtaining an intermediate state between glow discharge and electric arcs, named "filamentary" state. Filaments are intrinsically unstable but carry a high energy level, allowing a reduction of the time of processing and thus to accelerate the speed of the substrate. On the other side, owing to their random production, a paradoxically homogeneous deposition rate of materials is obtained, a very high number of micro-discharges being produced during a cycle on a given area. The use of a dielectric barrier discharge (DBD) has the advantage, over the other plasma processes, of operating at atmospheric pressure, and of allowing continuous treatment on large areas. Furthermore the energy supplied by a filamentary plasma may be finely modulated, thereby making it possible for films having a large variety of compositions to be deposited.

A process for depositing layers onto a substrate by dielectric barrier discharge is known from document EP 2145978. The described process includes in particular the insertion or passage of a substrate in a reaction chamber, in which an electrode and a counter-electrode are positioned. A dielectric barrier is placed between this electrode and this counter-electrode. A high-frequency electric voltage that causes the generation of a plasma is generated between the electrode and the counter-electrode. A gaseous composition is fed into the reaction chamber that upon contact with the plasma reacts with the surface of the substrate.

The electrodes are exposed to very severe working conditions: the high temperature of the plasma, the high reactivity of the injected and/or generated products, the voltage, current and frequency conditions for generating electrostatic forces and the occurrence of arcs at the surface of the electrode can cause localised breakdowns or can simply destroy the electrode. These problems are all the more evident in the case of electrodes placed in production lines with surfaces of large dimensions such as volumes of flat glass. A known method for reducing these problems is to glue the electrically insulating layer onto the face of the electrode facing the surface to be treated that is intended to be exposed to high voltage, e.g. according to WO 2011/134978.

However, in known installations we have observed concerns of contamination (e.g. soiling, clogging) of the high-voltage electrode and the dielectric in its vicinity that can result in a limited rate of deposition of the layer on the substrate as well as edge effects that can cause hot arcs that can in turn create irregularities in the layer and/or fractures of the substrate when it is made of glass and/or can damage the electrodes.

SUMMARY OF INVENTION

According to some of its aspects, the present invention relates to a device according to the independent claims, the dependent claims presenting preferred embodiments.

Therefore, the invention concerns a device for the surface treatment of a substrate by dielectric barrier discharge that enables the generation of a cold filamentary plasma at atmospheric pressure, comprising a reaction chamber, in which are positioned means for supporting and/or moving the substrate and at least two electrodes arranged in parallel on either side of the means for supporting and/or moving the substrate, of which one electrode is intended to be brought to high voltage and a counter-electrode to be earthed, characterised in that the counter-electrode has a width and a length that are respectively smaller than the width and the length of the electrode, and in that the counter-electrode is positioned so that it is enclosed in an orthogonal projection of the electrode on a plane containing the counter-electrode.

"Surface treatment" is understood here to mean any operation for preparing, cleaning, coating or depositing one or more layers on the surface of a substrate.

When the substrate is moving into the surface treatment device of the invention, the width of the counter-electrode or electrode is preferably its dimension in the direction of passage of the substrate and its length is its dimension perpendicular to the direction of passage of the substrate.

Such a device having a counter-electrode that has a smaller surface area than the electrode intended to be brought to high voltage and does not equal nor exceed this can thus have one or more of the following advantages:

it can supply a homogeneous plasma without any edge effect or arc likely to damage the electrodes and/or the dielectric barrier and/or cause irregularities in the deposited layer;

reduce contamination of the device and thus the device can be used for longer before cleaning is necessary;

allow an increased layer deposition rate;

in particular when the treatment is conducted continuously on a passing substrate.

Advantageously, the counter-electrode is positioned so that it is enclosed in a centred manner in the orthogonal projection of the electrode on the plane containing the counter-electrode. The risk of edge effect on the entire periphery, i.e. the four sides, of the electrode can be reduced by this.

Advantageously, the width of the counter-electrode is smaller than that of the electrode by at least 10 mm, preferably at least 20 mm, more preferred at least 30 mm.

Advantageously, the length of the counter-electrode is smaller than that of the electrode by at least 10 mm, preferably at least 20 mm, more preferred at least 30 mm.

According to a particularly advantageous embodiment the electrode is larger than the counter-electrode by at least 5 mm, preferably at least 10 mm, along each of its four sides.

According to a particular embodiment of the invention the device does not include any dielectric barrier as such, but is suitable to cause an insulating substrate that itself alone forms the dielectric barrier, e.g. a flat glass substrate, to pass.

Besides the abovementioned general advantages resulting from the difference in surface area between the electrode and the counter-electrode, this embodiment can have one or more of the following additional advantages:

it can provide a simplified implementation that no longer requires the installation of an independent dielectric barrier with all the difficulties that this can entail, e.g. with respect to its holding in place, or no longer requires the gluing of a dielectric plate onto the electrode with all the difficulties that this can entail, e.g. in terms of the difference in expansion coefficient of the materials forming the electrode and the dielectric;

allow the use of a lighter cooling system for the electrode intended to be brought to high voltage;

allow a discharge to be triggered more quickly with a lower voltage, i.e. allow the breakdown voltage to be reduced, and thus possibly allow a more significant spacing between the electrode and counter-electrode (in the order of 5-6 mm compared to generally 2 mm in previous systems), outside the substrate, and thus provide a greater flexibility to cause the substrate to pass between these. "Spacing between the electrode and counter-electrode, outside the substrate" is understood to mean the distance between the electrode and the counter-electrode reduced by the thickness of the substrate forming the gaseous space existing between the electrode and the counter-electrode. It is equal to the sum of the distance between the electrode and the substrate and the distance between the counter-electrode and the substrate.

supply a discharge energy closer to the substrate allowing a better deposition rate and a reduction in contamination.

Advantageously, in this embodiment and when the substrate is made of glass, the temperature thereof is at most 300° C., preferably at most 250° C. In fact glass (except for glasses of a very specific composition) tends to lose its dielectric properties at higher temperatures.

According to a particular embodiment of the invention alternative to the present one, the device includes a dielectric barrier consisting of a plate of dielectric material placed between the at least two electrodes to be adjacent to the counter-electrode. "Adjacent" is meant here to express proximity without necessarily direct contact.

Besides the abovementioned general advantages resulting from the difference in surface area between the electrode and the counter-electrode, this embodiment can have one or more of the following additional advantages:

it can provide a simplified implementation that allows the use of a lighter cooling system for the electrode intended to be brought to high voltage;

conduct a deposition on the face of the substrate facing the electrode with a better deposition rate and less contamination as a result of the dielectric barrier being located on the other side of the substrate;

cause the substrate to move at a higher temperature than in the alternative embodiment presented above without dielectric as such, and therefore provide a larger range of treatment temperatures.

Advantageously, in this embodiment the dielectric plate has a width and a length that are respectively greater than the width and the length of the counter-electrode and the counter-electrode is positioned so that it is enclosed, preferably in a centred manner, in an orthogonal projection of the dielectric plate on a plane containing the counter-electrode. The risk of edge effect on the entire periphery, i.e. the four sides, of the electrode can be reduced by this. When the substrate is moving into the surface treatment device of the invention, the width of the dielectric plate is preferably its dimension in the direction of passage of the substrate and its length is its dimension perpendicular to the direction of passage of the substrate.

According to this embodiment again the width and the length of the dielectric plate are preferably respectively greater than those of the counter-electrode by at least 10 mm, preferably at least 20 mm, more preferred at least 30 mm.

In the preferred embodiments of the invention the distance between the electrode and the substrate is greater than 2 mm, preferably at least 3 mm, more preferred at least 4 mm. Advantageously, the distance between the counter-electrode and the substrate can be greater than 1 mm, preferably at least 1.5 mm, more preferred at least 2 mm.

According to an advantageous embodiment the chamber is open at its two ends, which allows the treatment process to be integrated into an installation for continuous production. For example, the chamber can advantageously be integrated into a float glass production line, an annealing lehr, wherein the support means for the substrate comprise at least one roller. Alternatively, the means for moving the substrate comprise the tin bath of the float glass production line.

According to another preferred embodiment the chamber is closed, which allows the process of the invention to be integrated into a discontinuous surface treatment operation. The chamber can be positioned, for example, on "magnetron sputtering" treatment lines.

According to another of its aspects the present invention relates to a process.

Therefore, the invention also concerns a process for the surface treatment of a substrate comprising the following operations:

providing a device according to any one of the preceding claims;

feeding or passing a substrate (1) into the reaction chamber;

putting into operation a power supply that is stabilised in amplitude and frequency comprising a very high-frequency (VHF) and high-frequency (HF) transformer comprising a secondary circuit, the at least two electrodes being connected to the terminals thereof;

generating in the secondary circuit of this transformer a stabilised high-frequency electric voltage of such a value that it causes the generation of a filamentary plasma in the reaction chamber between the at least two electrodes;

feeding into the reaction chamber a mixture, the composition of which is such that on contact with the plasma, it breaks down and generates substances able to react with the surface of the substrate;

keeping the substrate in the chamber for a sufficient period of time to achieve the desired treatment on at least one of its faces.

It will be noted that the process of the invention is defined in terms of "operations" rather than "steps", i.e. that the succession of operations does not necessarily occur in the order in which they are outlined above.

The mixture fed into the reaction chamber preferably comprises an organic precursor of the material intended to be deposited as a layer. For example, for a layer of $SiO_2$ an organic precursor of silicon, preferably HMDSO, is used.

According to an advantageous embodiment the reactive mixture is fed via a passage into the reaction chamber opening into the space separating the two electrodes. The mixture is preferably fed into the reaction chamber in the form of a liquid by spraying, a reactive gas or powder.

Preferably, the process and device of the invention are working under alternative current.

According to an advantageous embodiment the plasma is generated on either side of the substrate between the electrode and the counter-electrode and the reactive mixture fed into the reaction chamber is fed on either side of the substrate. Such a process allows a surface treatment to be achieved on each side of the substrate. Moreover, reactive mixtures of different compositions can be fed into the reaction chamber on either side of the substrate. They can be confined in two separate zones by mechanical barriers, and the substrate itself can be part of these mechanical barriers.

According to an advantageous embodiment two counter-electrodes facing two electrodes are placed side by side in order to extend the deposition zone and, when the substrate passes, allow this to receive the treatment over a longer period of time and thus create a thicker layer, or alternatively with an identical treatment thickness, to increase the passage speed of the substrate inside the chamber.

Finally, according to another of its aspects the present invention relates to a glass sheet coated with a layer of $SiO_2$ deposited using a process such as that described above.

This layer is preferably substantially devoid of carbon and contains less than 1.0 at. % carbon.

This layer can be deposited directly onto the glass or form part of a lamination or stack of several layers.

BRIEF DESCRIPTION OF DRAWINGS

These aspects as well as other aspects of the invention will be clarified in the detailed description of particular embodiments of the invention with reference to the drawings of the figures, wherein.

The figures are not drawn to scale. In general, similar elements are represented by similar references in the figures.

DESCRIPTION OF EMBODIMENTS

Figure 1:
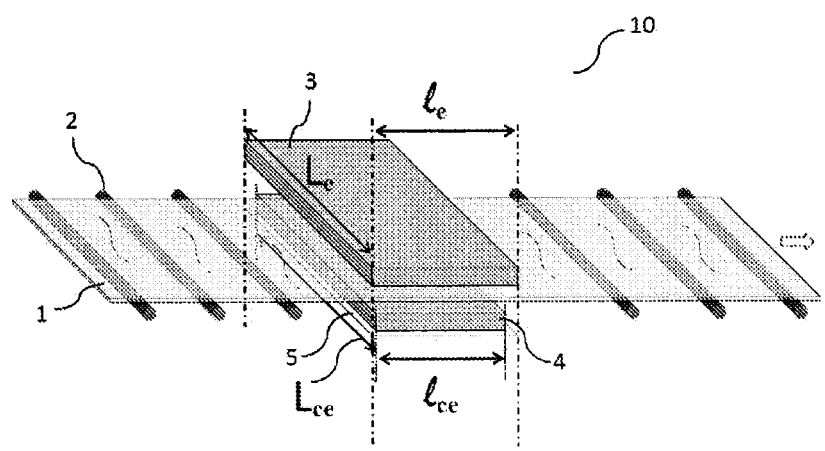
FIG. 1 is a schematic front view of an installation for depositing layers on a substrate according to the invention, in which the insulating substrate serves as dielectric barrier.
Figure 2:
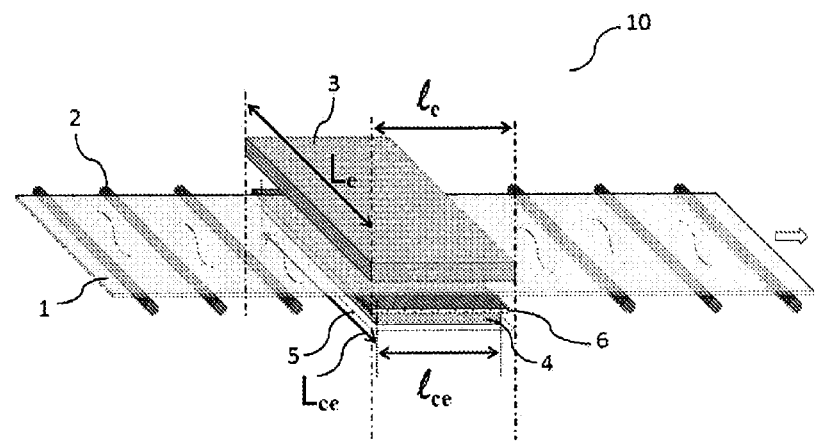
FIG. 2 is a schematic front view of an installation for depositing layers on a substrate according to the invention, in which the dielectric barrier is adjacent to the counter-electrode.
Figure 3:
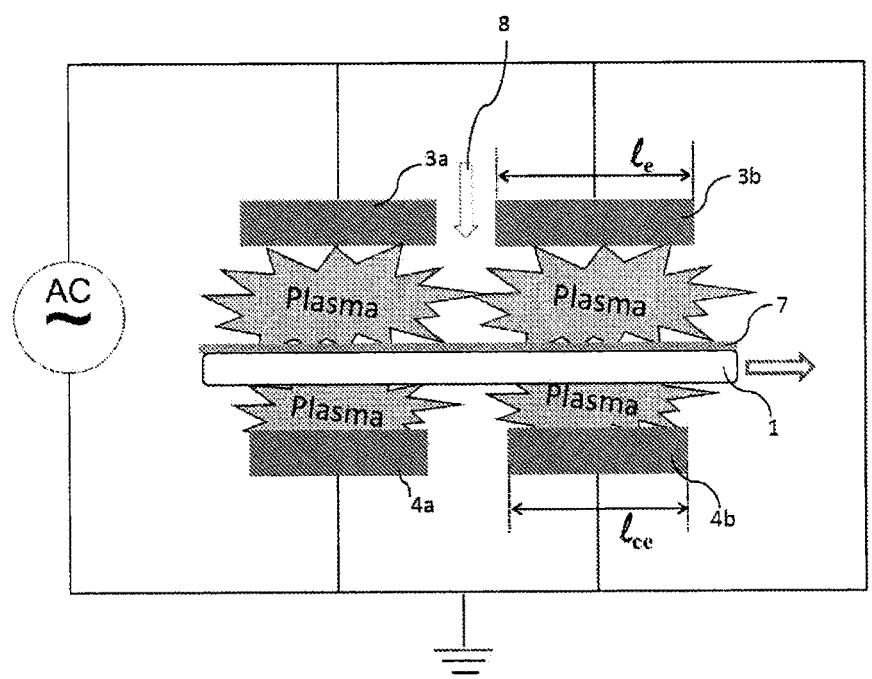
FIG. 3 is a schematic side view of an installation for depositing layers on a substrate according to example 1 of the invention, in which the insulating substrate serves as dielectric barrier.

FIGS. 1 to 3 show devices for continuous layer deposition 10 on a glass substrate 1 by dielectric barrier discharge. The glass substrate 1 passes inside a reaction chamber (not shown) in the direction marked by the arrow.

In FIGS. 1 and 3 the substrate 1 is insulating and serves as dielectric barrier between the electrode or electrodes 3, 3a, 3b and the counter-electrode or counter-electrodes 4, 4a, 4b.

In FIG. 2 a plate of insulating material (e.g. made of aluminium) 6 fixed to the counter-electrode 4 serves as dielectric barrier between the electrode 3 and the counter-electrode 4.

The width ($l_{ce}$) and the length ($L_{ce}$) of the counter-electrodes 4, 4a, 4b are smaller respectively than the width ($l_e$) and the length ($L_e$) of the electrodes 3, 3a, 3b and the counter-electrode 4 is enclosed in a centred manner in the orthogonal projection 5 of the electrode 3 on the plane containing the counter-electrode 4.

FIG. 3 shows a layer 7 in the course of being deposited onto the substrate 1 by reaction of a reactive mixture fed in the direction of arrow 8 in contact with the plasma that is also shown schematically.

EXAMPLE 1

In this example the deposition of a layer of $SiO_2$ onto glass was conducted in dynamic mode (i.e. continuously on the substrate during passage) using an installation as shown in FIG. 3 equipped with two electrode/counter-electrode pairs according to the invention for a treatment area of 240 $cm^2$, wherein each electrode has a width of 12 cm and a length of 10 cm.

The distance between the glass and the counter-electrodes is fixed at 2 mm and the distance between the glass and the electrodes is fixed at 4 mm. The electrodes extend 20 mm beyond the counter-electrodes over their entire periphery. Before treatment, the glass is at a temperature of 210° C. and has a passage speed of 10 m/min.

The reactive gas mixture is injected between the two high-voltage electrodes from above through an injection slot extending over a length of 10 cm parallel to the length of the electrodes. Two evacuations means for gases that have reacted are placed in front of the first electrode/counter-electrode pair and behind the second electrode/counter-electrode pair. The reactive gas mixture used is composed of oxygen (to eliminate the carbon) and nitrogen (as carrier gas) and HMDSO (Si-based precursor) according to the following flux values: $O_2$: 10-80 Nl/min; $N_2$: 200-500 Nl/min; HMDSO: 40-100 g/h. The extraction is fixed at 18 $Nm^3/h$.

A high-frequency high voltage (128 KHz) is respectively applied between the electrodes 3a, 3b and the counter-electrodes 4a, 4b. The applied voltage is sinusoidal, the counter-electrode is earthed and the high-voltage electrode is alternately negative and positive. The potential difference between the electrodes 3a, 3b and the respective counter-electrodes 4a, 4b causes the generation of a plasma with a discharge power of about 5-20 kW.

This process leads to a high deposition rate: 1500 nm·m/min, i.e. a thickness of $SiO_2$ of about 150 nm with a passage rate of the substrate of 10 m/min in the following conditions: 300 Nl/min $N_2$, 40 Nl/min $O_2$, 60 g/h HMDSO, 15 kW. The thickness of the layer is uniform over its entire surface and the layer is of good quality with little haze (less than 0.6) and a carbon content close to 0.

COMPARATIVE EXAMPLE 1

Not in Accordance with the Invention

In this example the deposition of a layer of $SiO_2$ onto glass was conducted as in example 1, except that:
the length and width of the electrodes and counter-electrodes were respectively identical, i.e. a width of 12 cm and a length of 10 cm, and
the distance between the glass and the counter-electrodes was fixed at 0.5 mm and the distance between the glass and the electrodes was fixed at 2 mm.

Both deposition rate of $SiO_2$ on glass and contamination (soiling) were compared between example 1 and comparative example 1. We have measured that around 40% of the precursor actually reacts for forming either the coating layer on glass or the soiling on the electrode. In comparative example 1, i.e. in a prior art installation, we have measured that around 50% of these 40% which actually react, are deposited as $SiO_2$ on glass and around 50% as soiling. In example 1, i.e. an example according to the present invention, around 80% of these 40% are deposited as $SiO_2$ on glass and 20% as soiling. This shows the advantage of the present invention which allows a better deposition rate and a reduction in contamination (contamination may for example lead to coating layer having an increased haze defect).

It will be evident to a person skilled in the art that the present invention is not limited to the examples illustrated and described above.

The invention claimed is:

1. A device for the surface treatment of a substrate by dielectric barrier discharge that enables the generation of a cold filamentary plasma at atmospheric pressure, comprising: a reaction chamber;
rollers in the chamber for supporting and/or moving the substrate; and at least two electrodes arranged in parallel on either side of the substrate, of which a first electrode is connected to a high voltage power supply and a second electrode is a counter-electrode that is earthed, wherein the counter-electrode has a width ($l_{ce}$) and a length ($L_{ce}$) that are respectively smaller than a width ($l_e$) and a length ($L_e$) of the first electrode, and in that the counter-electrode is positioned so that it is enclosed in an orthogonal projection of the first electrode on a plane containing the counter-electrode,
wherein the device does not include any dielectric barrier and that allows an insulating substrate that itself alone forms the dielectric barrier to pass.

2. The device according to claim 1, wherein the counter-electrode is positioned so that it is enclosed in a centered manner in the orthogonal projection of the first electrode on the plane containing the counter-electrode.

3. The device according to claim 1, wherein the width of the counter-electrode ($l_{ce}$) is smaller than that of the first electrode ($l_e$) by at least 10 mm.

4. The device according to claim 1, wherein the length of the counter-electrode ($L_{ce}$) is smaller than that of the first electrode ($L_e$) by at least 10 mm.

5. The device according to claim 1, wherein a distance between the first electrode and the substrate is greater than 2 mm.

6. A process for the surface treatment of a substrate, which comprises the following:
providing a device according to claim 1;
feeding or passing a substrate into the reaction chamber;
putting into operation a power supply that is stabilised in amplitude and frequency comprising a very high-voltage (VHV) and high-frequency (HF) transformer comprising a secondary circuit, the at least two electrodes being connected to the terminals thereof;
generating in the secondary circuit of this transformer a stabilised high-frequency electric voltage of such a value that it causes the generation of a filamentary plasma in the reaction chamber between the at least two electrodes;
feeding into the reaction chamber a mixture, the composition of which is such that on contact with the plasma, it breaks down and generates substances able to react with the surface of the substrate;
keeping the substrate in the chamber for a sufficient period of time to achieve the desired treatment on at least one of its faces.

7. The process according to claim 6, which is a process for depositing a layer onto a substrate.

8. The process according to claim 7, wherein the mixture fed into the reaction chamber comprises an organic precursor of silicon, and that it generates a layer of $SiO_2$.

9. A glass sheet coated with a layer of $SiO_2$ deposited by the process according to claim 8.

10. The device according to claim 3, wherein the width of the counter-electrode ($l_{ce}$) is smaller than that of the first electrode ($l_e$) by at least 20 mm.

11. The device according to claim 4, wherein the length of the counter-electrode ($L_{ce}$) is smaller than that of the first electrode ($L_e$) by at least 20 mm.

12. The device according to claim 5, wherein the distance between the first electrode and the substrate is greater than 3 mm.

13. The process according to claim 8, wherein organic precursor of silicon is HMDSO.

14. A device for the surface treatment of a dielectric substrate by dielectric barrier discharge, comprising:
a reaction chamber;
a first electrode connected to a power supply; and
a counter electrode that is earthed,
wherein the first electrode and the counter electrode are parallel to one another and are separated by a space sufficient for passage of the substrate, and
wherein the counter-electrode has a width ($l_{ce}$) and a length ($L_{ce}$) that are respectively smaller than a width ($l_e$) and a length ($L_e$) of the first electrode,
wherein the device does not include any dielectric barrier other than the substrate, and
wherein during operation the device is configured to generate a cold filamentary plasma at atmospheric pressure.

15. The device according to claim 14, wherein the counter-electrode is positioned so that it is enclosed in an orthogonal projection of the first electrode on a plane containing the counter-electrode.

* * * * *